(12) United States Patent
Lai et al.

(10) Patent No.: US 11,540,389 B1
(45) Date of Patent: Dec. 27, 2022

(54) SURFACE-TREATED COPPER FOIL AND COPPER CLAD LAMINATE

(71) Applicant: CHANG CHUN PETROCHEMICAL CO., LTD., Taipei (TW)

(72) Inventors: Chien-Ming Lai, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 17/485,482

(22) Filed: Sep. 26, 2021

(30) Foreign Application Priority Data

Jul. 6, 2021 (CN) .......................... 202110764339.9
Jul. 6, 2021 (TW) ................................ 110124716

(51) Int. Cl.
| | |
|---|---|
| *H05K 1/03* | (2006.01) |
| *B32B 15/04* | (2006.01) |
| *B32B 15/20* | (2006.01) |
| *C25D 1/04* | (2006.01) |

(52) U.S. Cl.
CPC .............. *H05K 1/03* (2013.01); *B32B 15/04* (2013.01); *B32B 15/20* (2013.01); *C25D 1/04* (2013.01); *B32B 2255/06* (2013.01); *B32B 2255/205* (2013.01); *B32B 2457/08* (2013.01); *H05K 2201/0355* (2013.01)

(58) Field of Classification Search
CPC ..... B32B 15/04; B32B 15/20; B32B 2255/06; B32B 2255/205; B32B 2457/08; C25D 1/04; H05K 1/03; H05K 2201/0355
See application file for complete search history.

(56) References Cited

FOREIGN PATENT DOCUMENTS

| CN | 107018623 B | * | 3/2020 | .............. C25D 1/04 |
|---|---|---|---|---|
| JP | 2012-169597 A | | 9/2012 | |
| JP | 6462961 B2 | | 1/2019 | |
| KR | 10-2014-0009322 A | | 1/2014 | |
| TW | 201251532 A1 | | 12/2012 | |
| TW | 201839178 A | | 11/2018 | |
| TW | 202020233 A | | 6/2020 | |
| TW | 202039939 A | | 11/2020 | |
| TW | 202120702 A | | 6/2021 | |
| WO | 2018/110579 A1 | | 6/2018 | |

OTHER PUBLICATIONS

Lai, the specification, including the claims, and drawings in the U.S. Appl. No. 17/543,645, filed Dec. 6, 2021.

* cited by examiner

*Primary Examiner* — Maria V Ewald
*Assistant Examiner* — Ethan Weydemeyer
(74) *Attorney, Agent, or Firm* — Winston Hsu

(57) ABSTRACT

A surface-treated copper foil including a treating surface, where the root mean square height (Sq) of the treating surface is in a range of 0.20 to 1.50 μm and the texture aspect ratio (Str) of the treating surface is not greater than 0.65. When the surface-treated copper foil is heated at a temperature of 200° C. for 1 hour, the ratio of the integrated intensity of (111) peak to the sum of the integrated intensities of (111) peak, (200) peak, and (220) peak of the treating surface is at least 60%.

11 Claims, 2 Drawing Sheets

SURFACE-TREATED COPPER FOIL AND COPPER CLAD LAMINATE

BACKGROUND OF THE INVENTION

1. Field of the Invention

The present disclosure relates to the field of copper foil, in particular to a surface-treated copper foil and a copper-clad laminate thereof.

2. Description of the Prior Art

With increasing demand for small-sized and thin electronic products capable of transmitting high-frequency signals, the demand for copper foils and copper-clad laminates is also increasing. Generally, the circuit of a copper-clad laminate is carried by the insulating board, and the electrical signals may be transmitted to a predetermined region along a predetermined path within the layout of the circuits. In addition, for the copper-clad laminate used for transmitting high-frequency electrical signals (for example, higher than 10 GHz), the circuit of the copper-clad laminate must be further optimized to reduce the signal transmission loss caused by a skin effect. The so-called skin effect means that with the increase in the frequency of the electrical signal, the transmission path of the current will be more concentrated on the surface of the conductive line, especially on the surface of the conductive line close to the board. In order to reduce the transmission loss of signal caused by skin effect, the conventional technique is to flatten the surface of the conductive line in the copper-clad laminate close to the board as much as possible. In addition, in order to maintain the adhesion strength between the conductive line surface and the board, a reverse treated foil (RTF) may also be used to make the conductive line. In particular, the reversed copper foil refers to a kind of copper foil whose drum side is treated with a roughening process.

Even if the aforementioned technique may effectively reduce the signal transmission loss caused by the copper-clad laminate, but when the surface of the conductive line is too flat, the adhesion strength between the conductive line and the board is usually reduced accordingly. Therefore, the conductive lines in the copper-clad laminate are easily peeled off from the surface of the board, and thereby the electrical signals may not be transmitted to the predetermined region along the predetermined path.

Therefore, there is still a need to provide a surface-treated copper foil and copper-clad laminate to solve the deficiencies and drawbacks in the prior art.

SUMMARY OF THE INVENTION

In view of the above, the present disclosure provides an improved surface-treated copper foil and copper-clad laminate, which solves the drawbacks existing in the prior art.

According to one embodiment of the present disclosure, a surface-treated copper foil is provided and includes a treating surface, where the root mean square height (Sq) of the treating surface is in a range of 0.20 to 1.50 µm and the texture aspect ratio (Str) of the treating surface is not greater than 0.65. When the surface-treated copper foil is heated at a temperature of 200° C. for 1 hour, the ratio of the integrated intensity of (111) peak to the sum of the integrated intensities of (111) peak, (200) peak, and (220) peak of the treating surface is at least 60%.

According to another embodiment of the present disclosure, a copper-clad laminate is provided, the copper-clad laminate includes a board and a surface-treated copper foil disposed on at least one surface of the board, where the surface-treated copper foil includes a bulk copper foil and a surface treatment layer disposed between the bulk copper foil and the board, where the surface treatment layer includes a treating surface facing the board, the root mean square height (Sq) of the treating surface is in a range of 0.20 to 1.50 µm and the texture aspect ratio (Str) of the treating surface is not greater than 0.65, where the ratio of the integrated intensity of (111) peak to the sum of the integrated intensities of (111) peak, (200) peak, and (220) peak of the treating surface is at least 60%.

According to the aforementioned embodiments, in the cases that the root mean square height (Sq) of the treating surface is in a range of 0.20 to 1.50 µm, the texture aspect ratio (Str) of the treating surface is not greater than 0.65, and the ratio of the integrated intensity of (111) peak to the sum of the integrated intensities of (111) peak, (200) peak, and (220) peak of the treating surface to is at least 60% after the surface-treated copper foil is heated at a temperature of 200° C. for 1 hour, as the surface-treated copper foil is subsequently laminated to the board, not only the adhesion strength and the reliability between the treating surface and the board may be maintained, but also the degree of transmission loss of the signal may be kept low, thereby fulfilling the requirement for the surface-treated copper foils and the copper-clad laminates required by the industry.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
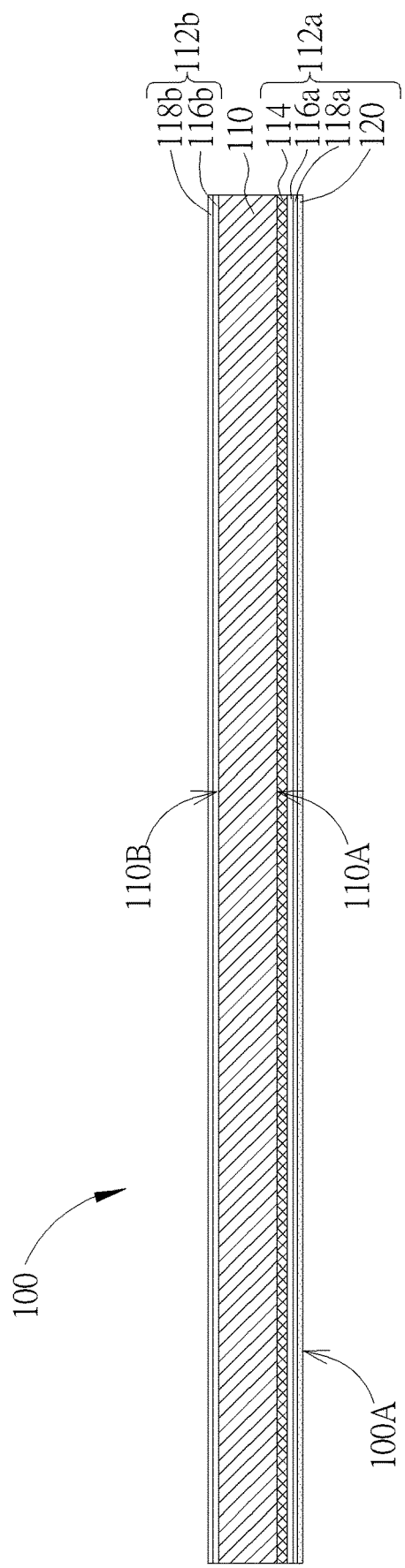
FIG. 1 is a schematic cross-sectional diagram of a surface-treated copper foil according to one embodiment of the present disclosure.

To provide a better understanding of the present disclosure to those of ordinary skill in the art, several exemplary embodiments of the present disclosure will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but may also include the meaning it is "above" or "over" something with no intermediate feature or layer therebetween (i.e., directly on something).

At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit and the scope of the present disclosure.

A surface-treated copper foil disclosed herein includes a treating surface, and the treating surface may face and be adhered to a board when the surface-treated copper foil is subsequently laminated to the board.

The surface-treated copper foil may include a bulk copper foil and an optional surface treatment layer. The bulk copper foil may be formed by electrodeposition (or electrolysis, electrolytic deposition, electroplating), and the bulk copper foil may have a drum side and a deposited side opposite to the drum side. Optionally, the surface treatment layer may be disposed on at least one of the drum side and the deposited side of the bulk copper foil. The surface treatment layer may be a single layer structure or a multi-layer stacked structure. For example, the surface treatment layer may be a multi-layer stacked structure including a plurality of sublayers, and each of the surface treatment layers may be respectively disposed on the drum side and the deposited side of the bulk copper foil, but is not limited thereto. The sublayers of each of the surface treatment layers may be selected from, but not limited to, the group consisting of a roughening layer, a barrier layer, an antirust layer and a coupling layer.

For the surface-treated copper foil according to the embodiments of the present disclosure, a root mean square height (Sq) of the treating surface may be in a range of 0.20 to 1.50 μm, and a texture aspect ratio (Str) of the treating surface may be not greater than 0.65. In addition, when the surface-treated copper foil is heated at a temperature of 200° C. for 1 hour, the ratio of the integrated intensity of (111) peak to the sum of the integrated intensities of (111) peak, (200) peak, and (220) peak of the treating surface is at least 60%. Since the treating surface of the surface-treated copper foil will be laminated to a board in the subsequent process, by controlling the root mean square height (Sq) and the texture aspect ratio (Str) of the treating surface of the surface-treated copper foil within the above numerical range, the peel strength between the surface-treated copper foil and the board may be improved, and the surface-treated copper foil may be more likely to pass the reliability test (using solder bath) in comparison with the conventional surface-treated copper foil. In addition, as the ratio of the integrated intensities of the crystal planes is further controlled within the above range, the transmission loss of high frequency signal may be further reduced.

In particular, the aforementioned "root mean square height (Sq)" refers to the root mean square height of every point of a surface in a specific area, which is equivalent to the standard deviation of heights. Since the root mean square height represents the root mean square value of heights (or the root mean square value of ordinary values), it is more sensitive to the variation in heights. According to one embodiment of the present disclosure, the root mean square height (Sq) of the treating surface of the surface-treated copper foil is in a range of 0.20 μm to 1.50 μm, such as 0.20 μm, 0.50 μm, 0.60 μm, 0.80 μm, 1.10 μm, 1.50 μm, or any value therebetween, preferably in a range of 0.21 μm to 1.44 am, and more preferably in a range of 0.60 μm to 1.25 μm.

The aforementioned "texture aspect ratio (Str)" refers to an index for measuring the consistency of surface texture in all directions within a certain surface, that is, for measuring the degree of isotropy and anisotropy of the surface. The value of the texture aspect ratio (Str) falls between 0 and 1. When the texture aspect ratio (Str) is 0 or close to 0, it means that the surface texture of the surface is significantly anisotropic and presents highly regular surface morphology. For example, when the texture aspect ratio (Str) is 0, the adjacent peaks and valleys may all be strip-shaped and arranged parallel to each other. In contrast, when the texture aspect ratio (Str) is 1 or close to 1, it means that the surface texture of the surface is strongly isotropic and presents a highly random surface morphology. For example, when the texture aspect ratio (Str) is 1, the peaks and valleys are randomly arranged. According to one embodiment of the present disclosure, the texture aspect ratio (Str) of the treating surface of the surface-treated copper foil is less than 0.65, for example, 0.05, 0.15, 0.25, 0.35, 0.45, 0.55, 0.65, or any value therebetween, preferably in a range of 0.10 to 0.65, and more preferably not greater than 0.60.

The integrated intensities of (111) peak, (200) peak, and (220) peak of the treating surface are measured by the grazing incidence X-ray diffraction (grazing angle may be 0.5° to 1.0°), which is used to characterize the proportion of each crystal plane in the surface region of the surface-treated copper foil (for example, the region with a depth of 0 μm to 1 μm from the treating surface). Therefore, the characteristics of the crystal planes in the surface region of the copper foil, instead of those in the inner region of the copper foil, may be revealed by the grazing incidence X-ray diffraction. In addition, because the copper (111) peak is less likely to reduce the electrical signal during the transmission of the high-frequency electrical signal, when the proportion of the copper (111) peak is increased, the degree of the transmission loss of high frequency signal may be thereby reduced. On the other hand, since the proportion of crystal planes of the bulk copper foil of the surface-treated copper foil may be varied and affected by the temperature and process duration of the subsequent heat treatment process (e.g., thermal lamination process), the surface-treated copper foil of the present disclosure is heated at the temperature of 200° C. for 1 hour to simulate the characteristics of the crystal planes of the surface-treated copper foil that is treated with the thermal lamination process. According to one embodiment of the present disclosure, when the surface-treated copper foil is heated at the temperature of 200° C. for 1 hour, the ratio of the integrated intensity of (111) peak to the sum of the integrated intensities of (111) peak, (200) peak, and (220) peak of the treating surface is at least 60%, preferably in a range of 60% to 90%, or the ratio of the integrated intensity of (220) peak to the sum of the integrated intensities of (111) peak, (200) peak, and (220) peak of the treating surface may be further less than 16.50%.

For the aforementioned surface-treated copper foil, the structure thereof is shown in FIG. 1 as example. FIG. 1 is a schematic cross-sectional diagram of a surface-treated copper foil according to one embodiment of the present disclosure. As shown in FIG. 1, the surface-treated copper foil 100 includes at least a treating surface 100A, and the surface-treated copper foil 100 includes at least a bulk copper foil 110.

In particular, the bulk copper foil 110 may be, for example, an electrodeposited copper foil or a rolled copper foil, and the thickness thereof is usually greater than or equal to 6 μm, such as in a range of 7 to 250 μm, or in a range of 9 and 210 μm, but not limited thereto. When the bulk copper foil 110 is an electrodeposited copper foil, the electrodeposited copper foil may be formed by electrodeposition (or electrolysis, electrolytic deposition, electroplating). The bulk copper foil 110 has a first surface 110A and a second surface 110B opposite to the first surface 110A. According to one embodiment of the present disclosure, when the bulk copper foil 110 is an electrodeposited copper foil, a drum side of the electrodeposited copper foil may correspond to the first surface 110A of the bulk copper foil 110, and a deposited side of the electrodeposited copper foil may correspond to the second surface 110B of the bulk copper foil 110, but is not limited thereto. According to one embodiment of the present disclosure, when the bulk copper foil 110 is the electrodeposited copper foil and the first surface 110A of the bulk copper foil 110 is the drum side of the electrodeposited copper foil, the drum side of the electrodeposited copper foil may be affected by the grain number or grain size number of the cathode drum of an electrodeposition apparatus during the electrodeposition process for forming the electrodeposited copper foil. Therefore, the drum side of the electrodeposited copper foil may show specific surface morphology, such as grinding marks, and the spatial distribution of the grinding marks may be isotropic or anisotropic, preferably anisotropic.

According to one embodiment of the present disclosure, other layers may be disposed on the first surface 110A and the second surface 110B of the bulk copper foil 110 respectively. For example, a surface treatment layer such as a first surface treatment layer 112a may be disposed on the first surface 110A, and/or another surface treatment layer such as a second surface treatment layer 112b may be disposed on the second surface 110B. The outer surface of the first surface treatment layer 112a may be regarded as the treating surface 100A of the surface-treated copper foil 100, and the treating surface 100A is in contact with a board during the subsequent process of laminating the surface-treated copper foil 100 to the board. According to other embodiments of the present disclosure, the first surface 110A and the second surface 110B of the bulk copper foil 110 may be further provided with other single-layer or multi-layer structures, or the surface treatment layers on the first surface 110A and the second surface 110B may be replaced by other single-layer or multi-layer structures, or no layers are disposed on the first surface 110A and the second surface 110B, but are not limited thereto. Therefore, in these embodiments, the treating surface 100A of the surface-treated copper foil 100 does not correspond to the outer surface of the first surface treatment layer 112a, but may correspond to the outer surface of the other single-layer or multi-layer structures, or may correspond to the first surface 110A and the second surface 110B of the bulk copper foil 110, but is not limited thereto.

The aforementioned first surface treatment layer 112a and the aforementioned second surface treatment layer 112b may each be a single layer or a stacked layer including a plurality of sublayers. In the case that the first surface treatment layer 112a is a stacked layer, each sublayer may be selected from the group consisting of a roughening layer 114, a first barrier layer 116a, a first antirust layer 118a and a coupling layer 120. In the case that the second surface treatment layer 112b is a multi-layered stacked structure including a plurality of sublayers, each sublayer may be selected from the group consisting of a second barrier layer 116b and a second antirust layer 118b. The compositions of the first barrier layer 116a and the second barrier layer 116b may be the same or different from each other, and the compositions of the first antirust layer 118a and the second antirust layer 118b may be the same or different from each other.

The aforementioned roughening layer 114 includes nodules. The nodules may be used to improve the surface roughness of the bulk copper foil 110, which may be copper nodules or copper alloy nodules. In order to prevent the nodules from peeling from the bulk copper foil 110, the roughening layer 114 may further include a covering layer disposed on the nodules to cover the nodules. According to one embodiment of the present disclosure, when the nodules in the roughening layer 114 are formed on the first surface 110A of the bulk copper foil 110 by electrodeposition, the distribution of the nodules may be affected by the surface morphology of the bulk copper foil 110, so that the arrangement of the nodules presents isotropic or anisotropic arrangement. For example, when the surface morphology of the first surface 110A of the bulk copper foil 110 presents anisotropic arrangement, the nodules correspondingly disposed on the surface may also present anisotropic arrangement. According to one embodiment of the present disclosure, since the entire thickness of the first barrier layer 116a, the first anti-rust layer 118a and the coupling layer 120 in the first surface treatment layer 112a is much smaller than the thickness of the roughening layer 114, the surface morphology of the treating surface 100A of the surface-treated copper foil 100, such as the root mean square height (Sq) and the texture aspect ratio (Str), is mainly affected by the roughening layer 114. In addition, the surface roughness of the treating surface 100A of the surface-treated copper foil 100 may be adjusted by adjusting the number and size of the nodules in the roughening layer 114. For example, for the nodules and the covering layer formed by electrodeposition, the morphology and arrangement of the nodules may be adjusted by adjusting the types of additives, the concentration of additives in the electrolyte and/or current density, but not limited thereto.

The aforementioned barrier layers, such as the first barrier layer 116a and the second barrier layer 116b, may have the same or different compositions, such as a metal layer or a metal alloy layer. In particular, the metal layer may be selected from but not limited to nickel, zinc, chromium, cobalt, molybdenum, iron, tin and vanadium, such as nickel layer, nickel-zinc alloy layer, zinc layer, zinc-tin alloy layer or chromium layer. In addition, the metal layer and the metal alloy layer may have a single-layer or multi-layer structure, such as zinc-containing and nickel-containing single layers stacked on each other. In the case of the multi-layer structure, the stacking sequence of the layers may be adjusted according to needs without certain restrictions, for example, the zinc-containing layer is stacked on the nickel-containing layer or the nickel-containing layer is stacked on zinc-containing layer. According to one embodiment of the present disclosure, the first barrier layer 116a is a double-layer structure including a zinc-containing layer and a nickel-containing layer stacked on each other, and the second barrier layer 116b is a single-layer structure including a zinc-containing layer.

The aforementioned antirust layer, such as the first antirust layer 118a and the second antirust layer 118b, is a coating layer applied to metal and is used to protect the metal from deterioration caused by corrosion or oxidation. The antirust layer includes, but not limited thereto, metal or organic compound. When the antirust layer includes metal, the metal may be chromium or chromium alloy, and the chromium alloy may further include one element selected from nickel, zinc, cobalt, molybdenum, vanadium and the combinations thereof. When the antirust layer includes organic compounds, non-limiting examples of organic molecules that may be used to form the organic antirust layer include porphyrin group, benzotriazole, triazine trithiol and the combinations thereof. The porphyrin group includes porphyrin, porphyrin macrocycle, enlarged porphyrin, contracted porphyrin, linear porphyrin polymer, porphyrin sandwich coordination complex, porphyrin array, 5,10,15,20-tetrakis-(4-aminophenyl)-porphyrin-Zn(II) and combinations thereof. According to one embodiment of the present disclosure, both the first antirust layer 118a and the second antirust layer 118b are made of chromium.

The coupling layer 120 may be made of silane, which are used to improve the adhesion strength between the surface-treated copper foil 100 and other materials (such as substrate film). The coupling layer 120 may be selected from but not limited to 3-aminopropyltrimethoxysilane, 3-aminopropyl-triethoxysilane, N-(2-aminoethyl)-3-aminopropyltrimethoxysilane, (3-glycidoxypropyl)trimethoxysilane, (3-glycidoxypropyl)triethoxysilane, (8-glycidoxyoctyl) trimethoxysilane and 3-methacryloxypropyltriethoxysilane. 8-acryloyloxyoctyltriethoxysilane, 3-methacryloxypropylt-rimethoxysilane, (3-mercaptopropyl)trimethoxysilane, (3-glycidyloxypropyl)trimethoxysilane, 1-[3-(trimethoxysilyl) propyl] urea, (3-chloropropyl) trimethoxysilane, dimethyldichlorosilane, 3-(trimethoxysilyl) propyl methacrylate, ethyl triacetoxysilane, isobutyl triethoxysilane, n-octyltriethoxysilane, tris(2-methoxyethoxy) vinylsilane, trimethylchlorosilane, methyltrichlorosilane, tetrachlorosilane, tetraethoxysilane, phenyltrimethoxysilane, chlorotriethoxysilane, ethylene-trimethoxysilane, alkoxysilane having 1 to 20 carbon atoms, vinylalkoxysilane having 1 to 20 carbon atoms, (methyl)acyl silane and the combinations thereof, but are not limited thereto.

The aforementioned surface-treated copper foil 100 may be further processed to fabricate a copper-clad laminate (CCL). The copper-clad laminate includes at least a board and a surface-treated copper foil. The surface-treated copper foil is disposed on at least one surface of the board, and the surface-treated copper foil includes a treating surface. In particular, the treating surface of the surface-treated copper foil may be in direct contact with and facing the board.

The aforementioned board may be made of bakelite board, polymer board or fiberglass board, but is not limited thereto. The polymer of the polymer board may be such as epoxy resins, phenolic resins, polyester resins, polyimide resins, acrylics, formaldehyde resins, bismaleimidetriazine resins, cyanate ester resin, fluorinated fluoropolymers, poly ether sulfone, cellulosic thermoplastics, polycarbonate, polyolefins, polypropylene, polysulfide, polyurethane, polyimide, liquid crystal polymer (LCP), and polyphenylene oxide (PPO). The aforementioned glass fiber board may be a prepreg formed by soaking glass fiber nonwoven fabric in the aforementioned polymer (e.g., epoxy resin).

The aforementioned copper-clad laminate may be further fabricated into a printed circuit board, and the steps may include patterning the electrodeposited copper foil to obtain conductive lines and then blackening the conductive lines. In particular, the blackening process is a treatment process using chemical bath and may include at least one pretreatment (for example, micro-etching or cleaning the surface of the conductive lines, etc.).

Methods for fabricating a surface-treated copper foil and a copper-clad laminate are further described as examples. Each step in the fabricating method is described as follows:

(1) Step A

Step A is performed to provide a bulk copper foil, such as an electrodeposited copper foil. An electrodeposition apparatus may be used to form electrodeposited copper foil (or referred to as a bare copper foil) by an electrodeposition process. Specifically, the electrodeposition apparatus includes at least a drum as a cathode, pairs of insoluble metal anode plates, and an inlet manifold for electrolyte solution. In particular, the drum is a rotatable metal drum, the surface thereof is a mirror polished surface. The metal anode plates may be separated from and fixedly disposed at the lower half of the metal cathode drum to surround the lower half of the metal cathode drum. The feeding manifold may be fixedly disposed under the metal cathode drum and between two metal anode plates.

During the electrodeposition process, the feeding manifold continuously supplies electrolyte solution between the drum and the metal anode plates. By applying current or voltage between the drum and the metal anode plates, copper may be electrodeposited on the drum to form a bulk copper foil. In addition, the continuous bulk copper foil may be manufactured by continuously rotating the drum and peeling the bulk copper foil from one side of the drum. The surface of the bulk copper foil facing the drum may be referred to as a drum side, while the surface of the electrodeposited copper foil away from the drum may be referred to as a deposited side. In addition, during the electrodeposition process, the surface of the cathode drum will be slightly oxidized, resulting in a rugged surface, thereby reducing the flatness of the drum side of the bulk copper foil. Therefore, a polish buff may be further disposed adjacent to the cathode drum to form a contact surface between the cathode drum and the polish buff. By rotating the cathode drum and the polishing buff in opposite directions, the oxide layer on the surface of the cathode drum may be removed by the polishing buff, thus maintaining the surface flatness of the cathode drum.

For the bulk copper foil, the fabricating parameters are described as follows:

<1.1 Composition of Electrolyte Solution and Electrolysis Conditions for Bare Copper Foil>

Copper sulfate ($CuSO_4 \cdot 5H_2O$): 320 g/L
Sulfuric acid: 95 g/L
Chloride ion (from hydrochloric acid, manufactured by RCI Labscan Ltd.): 30 mg/L (ppm)
Liquid temperature: 50° C.
Current density: 70 A/dm$^2$
Thickness of bare copper foil: 35 μm <1.2 Cathode Drum>

Material: Titanium
Grain size number: 6, 7, 7.5, 9

<1.3 Polish Buff>

Type (Nippon Tokushu Kento Co., Ltd): #500, #1000, #1500, #2000

(2) Step B

In step B, a surface cleaning process is performed on the bulk copper foil to ensure that the surface of the bulk copper foil is free of contaminant (such as oil stains and oxides), the fabricating parameters are described as follows:

<2.1 Composition and Cleaning Conditions of Cleaning Solution>

Copper sulfate ($CuSO_4 \cdot 5H_2O$): 200 g/L
Sulfuric acid: 100 g/L
Liquid temperature: 25° C.

Soaking time: 5 seconds (3) Step C

In step C, a roughening layer is formed on the drum side of the aforementioned bulk copper foil. For example, the nodules may be formed on the drum side of the bulk copper foil by an electrodeposition process. In addition, in order to prevent the nodules from falling, a covering layer may be further formed on the nodules. The fabricating parameters of the roughening layer (including the nodules and the covering layer) are described as follows:

<3.1 Parameters for Fabricating Nodules>
Copper sulfate ($CuSO_4.5H_2O$): 150 g/L
Sulfuric acid: 100 g/L
Titanium sulfate ($Ti(SO_4)_2$): 150 to 750 mg/L (ppm)
Sodium tungstate ($Na_2WO_4$): 50 to 450 mg/L (ppm)
Liquid temperature: 25° C.
Current density: 40 A/dm$^2$
Processing time: 10 seconds <3.2 Parameters for Fabricating Covering Layer>
Copper sulfate ($CuSO_4.5H_2O$): 220 g/L
Sulfuric acid: 100 g/L
Liquid temperature: 40° C.
Current density: 15 A/dm$^2$
Processing time: 10 seconds (4) Step D In step D, a barrier layer is formed on each side of the bulk copper foil, for example, by an electrodeposition process, so as to form a barrier layer with a double-layer stacked structure (e.g., nickel-containing layer/zinc-containing layer, but not limited thereto) on the side of the bulk copper foil having the roughening layer, while to form a barrier layer with a single-layer structure (e.g., zinc-containing layer, but not limited thereto) on the side of the bulk copper foil without the roughening layer. The fabricating parameters thereof are described as follows:

<4.1 Electrolyte Composition and Electrodeposition Conditions for Forming Nickel-Containing Layer>
Nickel sulfate ($NiSO_4.7H_2O$): 180 g/L
Boric acid ($H_3BO_3$): 30 g/L
Sodium hypophosphite ($NaH_2PO_2$): 3.6 g/L
Liquid temperature: 20° C.
Current density: 0.2 A/dm$^2$
Processing time: 10 seconds <4.2 Electrolyte Composition and Electrodeposition Conditions for Forming Zinc-Containing Layer>
Zinc sulfate ($ZnSO_4.7H_2O$): 9 g/L
Ammonium vanadate (($NH_4)_3VO_4$): 0.3 g/L
Liquid temperature: 20° C.
Current density: 0.2 A/dm$^2$
Processing time: 10 seconds (5) Step E In step E, an antirust layer, such as a chromium-containing layer, is formed on the barrier layer on each side of the aforementioned bulk copper foil, and the fabricating parameters are described as follows:

<5.1 Electrolyte Composition and Electrodeposition Conditions for Forming Chromium-Containing Layer>
Chromium trioxide ($CrO_3$): 5 g/L
Liquid temperature: 30° C.
Current density: 5 A/dm$^2$
Processing time: 10 seconds (6) Step F In step F, a coupling layer is formed on the side of the bulk copper foil having the roughening layer, the barrier layer and the antirust layer. For example, after the completion of the aforementioned electrodeposition process, the bulk copper foil is cleaned by water, and the surface of the bulk copper foil is not subject to a drying process. Afterwards, an aqueous solution containing silane coupling agent is sprayed on the antirust layer on the side of the bulk copper foil having the roughening layer, so that the silane coupling agent is adsorbed on the surface of the antirust layer. Subsequently, the bulk copper foil may be dried in an oven. The fabricating parameters are described as follows:

<6.1 Parameters for Fabricating a Silane Coupling Agent>
Silane coupling agent: 3-glycidoxypropyltrimethoxysilane (KBM-403)
Concentration of the silane coupling agent in aqueous solution: 0.25 wt. %
Spraying time: 10 seconds (7) Step G In Step G, the surface-treated copper foil (including the bulk copper foil and the surface-treated layers disposed on each side of the bulk copper foil) formed by the aforementioned steps is laminated to a board to form a copper-clad laminate. According to one embodiment of the present disclosure, the copper-clad laminate may be formed by thermal laminating the surface-treated copper foil 100 shown in FIG. 1 to the board.

In order to enable a person having ordinary skill in the art to implement the present disclosure, the specific examples regarding a copper foil with carrier and a copper-clad laminate are further elaborated below. It should be noted, however, that the following examples are for illustrative purposes only and should not be construed to limit the present disclosure. That is, the materials, the amounts and ratios of the materials, and the processing flow in the respective examples may be appropriately modified so long as these modifications are within the spirit and scope of the present disclosure as defined by the appended claims.

EXAMPLES

Examples 1-16

Examples 1-16 are surface-treated copper foils, and the fabricating process includes steps A to F in the aforementioned fabricating methods. The fabricating parameters that differ from those of the aforementioned fabricating process are shown in TABLE 1. Specifically, the structures of the surface-treated copper foils of Examples 1-16 are shown in FIG. 1, where a nickel-containing layer, a zinc-containing layer, a chromium-containing layer and a coupling layer are sequentially formed on the roughening layer, and a zinc-containing layer and a chromium-containing layer are sequentially formed on the side of the bulk copper foil without the roughened layer. The thickness of surface-treated copper foil is 35 µm.

TABLE 1

| | Polish | Cathod | Roughening layer | | |
|---|---|---|---|---|---|
| | buff Type (#) | drum Grain size number | $Ti(SO_4)_2$ (ppm) | $Na_2WO_4$ (ppm) | Current density (ASD) |
| Ex. 1 | 1500 | 7.5 | 450 | 250 | 40 |
| Ex. 2 | 1000 | 7.5 | 450 | 250 | 40 |
| Ex. 3 | 2000 | 7.5 | 450 | 250 | 40 |
| Ex. 4 | 1500 | 7 | 450 | 250 | 40 |
| Ex. 5 | 1500 | 9 | 450 | 250 | 40 |
| Ex. 6 | 1500 | 7.5 | 300 | 250 | 40 |
| Ex. 7 | 1500 | 7.5 | 600 | 250 | 40 |
| Ex. 8 | 1500 | 7.5 | 450 | 150 | 40 |
| Ex. 9 | 1500 | 7.5 | 450 | 350 | 40 |

TABLE 1-continued

|  | Polish buff Type (#) | Cathod drum Grain size number | Roughening layer | | |
|---|---|---|---|---|---|
|  |  |  | Ti(SO$_4$)$_2$ (ppm) | Na$_2$WO$_4$ (ppm) | Current density (ASD) |
| Ex. 10 | 500 | 7.5 | 450 | 250 | 40 |
| Ex. 11 | 2500 | 7.5 | 450 | 250 | 40 |
| Ex. 12 | 1500 | 6 | 450 | 250 | 40 |
| Ex. 13 | 1500 | 7.5 | 150 | 250 | 40 |
| Ex. 14 | 1500 | 7.5 | 750 | 250 | 40 |
| Ex. 15 | 1500 | 7.5 | 450 | 50 | 40 |
| Ex. 16 | 1500 | 7.5 | 450 | 450 | 40 |

The test results of the aforementioned Examples 1-16, such as <Root mean square height (Sq)>, <Texture aspect ratio (Str)>, <Ratio of crystal planes>, <Peel strength>, <Reliability>, and <Signal transmission loss> are further elaborated below. The test results are shown in TABLE 2.

<Root Mean Square Height (Sq)> and <Texture Aspect Ratio (Str)>

Root mean square height (Sq) and texture aspect ratio (Str) of the treating surface of the surface-treated copper foil were defined in accordance with ISO 25178-2: 2012 by using surface texture analysis of a laser microscope (LEXT OLS5000-SAF, manufactured by Olympus). Specific measurement conditions are as follows:
Wavelength of light source: 405 nm
Objective lens magnification: 100× objective lens (MPLAPON-100× LEXT, manufactured by Olympus)
Optical zoom: 1.0×
Image area: 129 μm×129 μm
Resolution: 1024 pixels×1024 pixels
Mode: the Auto tilt removal
Filter: unfiltered
Ambient temperature: 24±3° C.
Relative humidity: 63±3%

<Ratio of Crystal Planes>

The oven temperature was set to 200° C. When the temperature of the oven reached 200° C., the surface-treated copper foil of any of the aforementioned embodiments was placed into the oven to let the surface-treated copper foil undergo a heat treatment process. After heating for 1 hour, the surface-treated copper foil was taken out of the oven and placed in room temperature. A grazing incidence X-ray diffraction (GIXRD) was performed on the treating surface of the surface-treated copper foil (i.e., the side having the roughening layer, the barrier layer, the antirust layer and the coupling layer) to determine the integrated intensities of diffraction peaks of crystal planes near the treating surface of the surface treated copper foil. For example, for the crystal planes of copper (111), copper (200), and copper (220) at the drum side of the bulk copper foil and within a certain depth from the drum side, the integrated intensities of the peaks of these crystal planes were measured. Specific measurement conditions are as follows:
Measuring instrument: X-ray diffraction analyzer (D8 ADVANCE Eco, Bruker Co.)
Grazing angle: 0.8°

<Peel Strength>

Six commercially available resin sheets (S7439G, manufactured by Shengyi Technology Co.), each having a thickness of 0.09 mm, were stacked together to form a resin sheet stacked layer, and the surface-treated copper foil of any of the aforementioned examples (size: 125 mm×25 mm) was disposed on the resin sheet stacked layer in a way that the treating surface of the surface-treated copper foil faces the resin sheet stacked layer. Then, the surface-treated copper foil and the resin sheet stacked layer were laminated to form a copper-clad laminate. The pressing conditions are as follows:
Temperature: 200° C.
Pressure: 400 psi
Pressing time: 120 minutes Afterwards, a universal testing machine was used to peel the surface-treated copper foil from the copper-clad laminate at an angle of 90° in accordance with the standard JIS C 6471.
The peeling conditions are as follows:
Peeling instrument: universal testing machine, Shimadzu AG-I
Peeling angle: 90°
Criteria for the judgement: the peeling strength is higher than 4 lb/in <Reliability>

Six commercially available resin sheets (S7439G, manufactured by SyTech Corporation), each having a thickness of 0.076 mm, were stacked together to form a resin sheet stacked layer, and the treating surface of the surface-treated copper foil of any of the aforementioned embodiments was arranged to face the resin sheet stacked layer. Then, the surface-treated copper foil and the resin sheet stacked layer were laminated to form a copper-clad laminate. The pressing conditions are as follows: temperature: 200° C., pressure: 400 psi, and pressing time: 120 minutes.

Afterwards, a pressure cooker test (PCT) was conducted, and the conditions in the oven were set as follows: temperature: 121° C., pressure: 2 atm, and humidity: 100% RH. The copper-clad laminate was placed in the oven for 30 minutes, and then taken out and cooled to room temperature. Then, a solder bath test was performed during which the copper-clad laminate treated by the pressure cooker test was soaked in a molten solder bath at a temperature of 288° C. for 10 seconds.

The solder bath test may be repeatedly performed on the same sample, and after each solder bath test, observe whether the copper-clad laminate has blister, crack, delamination and other abnormal phenomena. If any of the above abnormal phenomena occurs, it is judged that the copper-clad laminate failed the solder bath test. The test results are shown in TABLE 2. The criteria for the judgement are as follows:
A: The copper-clad laminate still has no abnormal phenomenon after more than 50 solder bath tests
B: The copper-clad laminate has abnormal phenomena after 10~50 solder bath tests
C: The copper-clad laminate has abnormal phenomena after less than 10 solder bath tests <Signal Transmission Loss>

Figure 2:
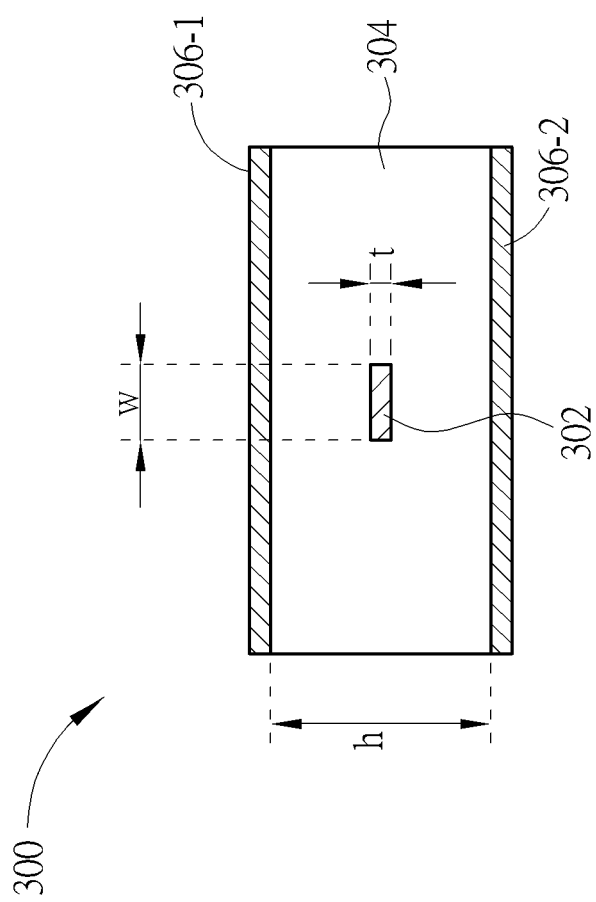
FIG. 2 is a schematic diagram of a strip-line according to one embodiment of the present disclosure.

The surface-treated copper foil of any of the aforementioned embodiments was made into a strip-line as shown in FIG. 2, and the corresponding signal transmission loss was measured. Specifically, for a strip-line 300, the surface-treated copper foil of any of the aforementioned embodiments is attached to the resin (S7439G, manufactured by Shengyi Technology Co.) with a thickness of 152.4 μm, subsequently the surface-treated copper foil is made into a conductive line 302, and then two other pieces of resin (S7439G, manufactured by Shengyi Technology Co.) were used to cover the two side surfaces respectively, so that the conductive line 302 is disposed in a dielectric body (S7439G, manufactured by Shengyi Technology Co.) 304. The strip-line 300 may further include two grounded electrodes 306-1 and 306-2 disposed on opposite sides of the dielectric body 304, respectively. The grounded electrode 306-1 and the grounded electrode 306-2 may be electrically connected to each other through the conductive via hole, so that the grounded electrode 306-1 and the grounded electrode 306-2 have equal potential. The specifications of each component in the strip-line 300 are as follows:
The length of the conductive line 302: 100 mm
The width w: 120 μm
The thickness t: 35 μm
The dielectric characteristic of the dielectric body 304: Dk=3.74 and Df=0.006 (measured at 10 GHz signal according to IPC-TM 650 No. 2.5.5.5)
The characteristic impedance: 50Ω.
State: without covering film For the measurement of the signal transmission loss, which is measured according to the standard Cisco S3 method, the signal analyzer is used to input the electrical signal from one end of the conductive line 302 when the grounded electrodes 306-1 and 306-2 are both at the ground potential, and measures the output value at the other end of the conductive line 302 to determine the signal transmission loss caused by the strip-line 300. Specific measurement conditions are as follows:
Signal analyzer: PNA N5227B (Keysight Technologies)
Frequency of electrical signal: 10 MHz to 20 GHz
Sweeping points: 2000 points
Calibration mode: E-Cal (cal kit: N4692D)

The degree of signal transmission loss of the corresponding strip-line is judged under the condition that the frequency of the electrical signal is set at 10 GHz. In particular, when the absolute value of signal transmission loss is smaller, it means that the degree of signal loss is less. The criteria for the judgement are as follows:
A (the signal transmission performance is best): the absolute value of signal transmission loss is less than 0.80 dB/in
B (the signal transmission performance is good): the absolute value of signal transmission loss is in a range of 0.80 to 0.85 dB/in
C (the signal transmission performance is worst): the absolute value of signal transmission loss is larger than 0.85 dB/in

TABLE 2

| | Treating surface of surface-treated copper foil | | | | | | Signal trans-mission loss |
|---|---|---|---|---|---|---|---|
| | | The ratio of the integrated intensity of peak | | | Peel strength | Reli-abil- | |
| Sq (μm) | Str | (111) | (200) | (220) | (lb/in) | ity | |
| Ex. 1 | 0.64 | 0.19 | 68.6 | 19.3 | 12.1 | 5.11 | A | B |
| Ex. 2 | 0.71 | 0.29 | 74.1 | 18.7 | 7.2 | 5.41 | A | B |
| Ex. 3 | 0.60 | 0.38 | 88.0 | 9.4 | 2.6 | 4.94 | A | A |
| Ex. 4 | 0.66 | 0.31 | 61.8 | 23.1 | 15.1 | 5.24 | A | B |
| Ex. 5 | 0.65 | 0.13 | 89.8 | 7.8 | 2.4 | 4.51 | A | A |
| Ex. 6 | 0.15 | 0.20 | 75.5 | 20.2 | 4.3 | 5.42 | A | A |
| Ex. 7 | 0.21 | 0.24 | 70.9 | 19.5 | 9.6 | 4.06 | B | B |
| Ex. 8 | 1.44 | 0.12 | 74.2 | 17.9 | 7.9 | 5.90 | A | B |
| Ex. 9 | 0.32 | 0.21 | 83.8 | 12.3 | 3.9 | 4.39 | B | A |
| Ex. 10 | 1.25 | 0.21 | 51.3 | 16.4 | 32.4 | 5.73 | A | C |
| Ex. 11 | 0.83 | 0.84 | 66.2 | 15.9 | 17.9 | 5.17 | C | C |
| Ex. 12 | 0.96 | 0.68 | 48.4 | 20.6 | 31.0 | 5.67 | C | C |
| Ex. 13 | 1.80 | 0.29 | 64.1 | 19.4 | 16.5 | 5.30 | A | C |
| Ex. 14 | 0.17 | 0.62 | 71.6 | 21.5 | 6.9 | 2.15 | C | B |
| Ex. 15 | 1.65 | 0.23 | 57.2 | 19.5 | 23.3 | 5.69 | A | C |
| Ex. 16 | 0.19 | 0.65 | 72.7 | 17.8 | 9.5 | 2.84 | C | B |

For the aforementioned Examples 1-9 according to TABLE 2, while the root mean square height (Sq) of the treating surface is in a range of 0.20 to 1.50 μm and the texture aspect ratio (Str) of the treating surface is not greater than 0.65 (such as in a range of 0.10 to 0.65), and the surface-treated copper foil has been carried out a heat treatment process, where the ratio of the integrated intensity of copper (111) peak to the sum of the integrated intensities of copper (111) peak, copper (200) peak, and copper (220) peak of the treating surface is at least 60% (such as in a range of 60% to 90%), the corresponding peel strengths are higher than 4.06 lb/in, the corresponding reliabilities achieve class A or class B, and the corresponding signal transmission losses achieve class A or class B. In contrast, for Examples 10-16, while any of the root mean square height (Sq), the texture aspect ratio (Str) or the ratio of the integrated intensities of peaks is not falling in the aforementioned range, even if the peel strength is higher than 4.06 lb/in in the specific Examples (such as Examples 10-13, 15), at least one of the corresponding reliabilities or signal transmission losses in these examples must fall into class C.

In addition, for Examples 1-9, after the surface-treated copper foil is treated with a heat treatment process, where the ratio of the integrated intensity of copper (220) peak to the sum of the integrated intensities of copper (111) peak, copper (200) peak, and copper (220) peak of the treating surface is less than 16.50%, the corresponding peel strengths are higher than 4.06 lb/in, the corresponding reliabilities achieve class A or class B, and the corresponding signal transmission losses achieve class A or class B.

According to each embodiment of the present disclosure, by controlling the morphology of the treating surface of the surface-treated copper foil, and by controlling the ratio of the crystal planes of the bulk copper foil near the drum side, the corresponding copper-clad laminate and printed circuit board not only have improved adhesion strength and reliability between the surface-treated copper foil and the board, but also have reduced transmission loss of high-frequency electrical signals transmitted within the conductive pattern at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A surface-treated copper foil, comprising a treating surface, wherein a root mean square height (Sq) of the treating surface is in a range of 0.20 to 1.50 μm and a texture aspect ratio (Str) of the treating surface is not greater than 0.65, and when the surface-treated copper foil is heated at a temperature of 200° C. for 1 hour, the ratio of the integrated intensity of a copper (111) peak to the sum of the integrated intensities of the copper (111) peak, a copper (200) peak, and a copper (220) peak of the treating surface is at least 60%.

2. The surface-treated copper foil of claim 1, wherein the texture aspect ratio (Str) of the treating surface is in a range of 0.10 to 0.65.

3. The surface-treated copper foil of claim 1, wherein the ratio of the integrated intensity of the copper (111) peak to the sum of the integrated intensities of the copper (111) peak, the copper (200) peak, and the copper (220) peak of the treating surface is in a range of 60% to 90%.

4. The surface-treated copper foil of claim 1, wherein the integrated intensities of the copper (111) peak, the copper (200) peak, and the copper (220) peak of the treating surface are measured by grazing incidence X-ray diffraction with a grazing angle in a range of 0.5° to 1.0°.

5. The surface-treated copper foil of claim 1, wherein, when the surface-treated copper foil is heated at a temperature of 200° C. for 1 hour, the ratio of the integrated intensity of the copper (220) peak to the sum of the integrated intensities of the copper (111) peak, the copper (200) peak, and the copper (220) peak of the treating surface is less than 16.50%, and an absolute value of a signal transmission loss of the surface-treated copper foil is less than or equal to 0.85 dB/in.

6. The surface-treated copper foil of claim 1, further comprising:
    a bulk copper foil; and
    a surface treatment layer, disposed on at least one surface of the bulk copper foil, wherein an outermost side of the surface treatment layer is the treating surface.

7. The surface-treated copper foil of claim 6, wherein the bulk copper foil is an electrodeposited copper foil, wherein the surface treatment layer comprises a sublayer, and the sublayer is a roughening layer.

8. The surface-treated copper foil of claim 7, wherein the surface treatment layer further comprises at least one further sublayer, the at least one further sublayer is selected from the group consisting of a barrier layer and a coupling layer.

9. The surface-treated copper foil of claim 8, wherein the barrier layer comprises at least one metal, the metal is selected from the group consisting of nickel, zinc, chromium, cobalt, molybdenum, iron, tin and vanadium.

10. A copper-clad laminate, comprising:
    a board; and
    a surface-treated copper foil, disposed on at least one surface of the board, wherein the surface-treated copper foil comprises:
    a bulk copper foil; and
    a surface treatment layer, disposed between the bulk copper foil and the board, wherein the surface treatment layer comprises a treating surface facing toward the board, and a root mean square height (Sq) of the treating surface is in a range of 0.20 to 1.50 μm and a texture aspect ratio (Str) of the treating surface is not greater than 0.65, wherein the ratio of the integrated intensity of a copper (111) peak to the sum of the integrated intensities of the copper (111) peak, a copper (200) peak, and a copper (220) peak of the treating surface is at least 60%.

11. The copper-clad laminate of claim 10, wherein the treating surface of the surface treatment layer is in direct contact with the board.

\* \* \* \* \*